(12) United States Patent
Ohnuma

(10) Patent No.: US 7,973,316 B2
(45) Date of Patent: Jul. 5, 2011

(54) SEMICONDUCTOR DEVICE AND METHOD FOR MANUFACTURING SEMICONDUCTOR DEVICE

(75) Inventor: Hideto Ohnuma, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 47 days.

(21) Appl. No.: 12/051,069

(22) Filed: Mar. 19, 2008

(65) Prior Publication Data

US 2008/0237805 A1    Oct. 2, 2008

(30) Foreign Application Priority Data

Mar. 26, 2007   (JP) ................ 2007-080376

(51) Int. Cl.
  *H01L 21/46*   (2006.01)
  *H01L 23/52*   (2006.01)
  *H01L 27/088*  (2006.01)
  *H01L 33/00*   (2006.01)

(52) U.S. Cl. .......... 257/72; 257/368; 257/618; 257/773; 257/E27.06; 257/E23.141; 257/E33.066; 438/458; 438/149

(58) Field of Classification Search ............ 257/67, 257/618
See application file for complete search history.

(56) References Cited

U.S. PATENT DOCUMENTS

| | | | |
|---|---|---|---|
| 7,566,633 B2 | 7/2009 | Koyama et al. | |
| 2006/0202206 A1* | 9/2006 | Koyama et al. | 257/67 |

FOREIGN PATENT DOCUMENTS

| | | |
|---|---|---|
| JP | 2005-350823 | 12/2005 |
| JP | 2006-270077 | 10/2006 |

* cited by examiner

*Primary Examiner* — Marcos D Pizarro
*Assistant Examiner* — Raj Gupta
(74) *Attorney, Agent, or Firm* — Husch Blackwell LLP

(57) ABSTRACT

An object is to provide a semiconductor device which is not easily broken even if stressed externally and a method for manufacturing such a semiconductor device. A semiconductor device includes an element layer including a transistor in which a channel is formed in a semiconductor layer and insulating layers which are formed as an upper layer and a lower layer of the transistor respectively, and a plurality of projecting members provided at intervals of from 2 to 200 μm on a surface of the element layer. The longitudinal elastic modulus of the material for forming the plurality of projecting members is lower than that of the materials of the insulating layers.

21 Claims, 11 Drawing Sheets

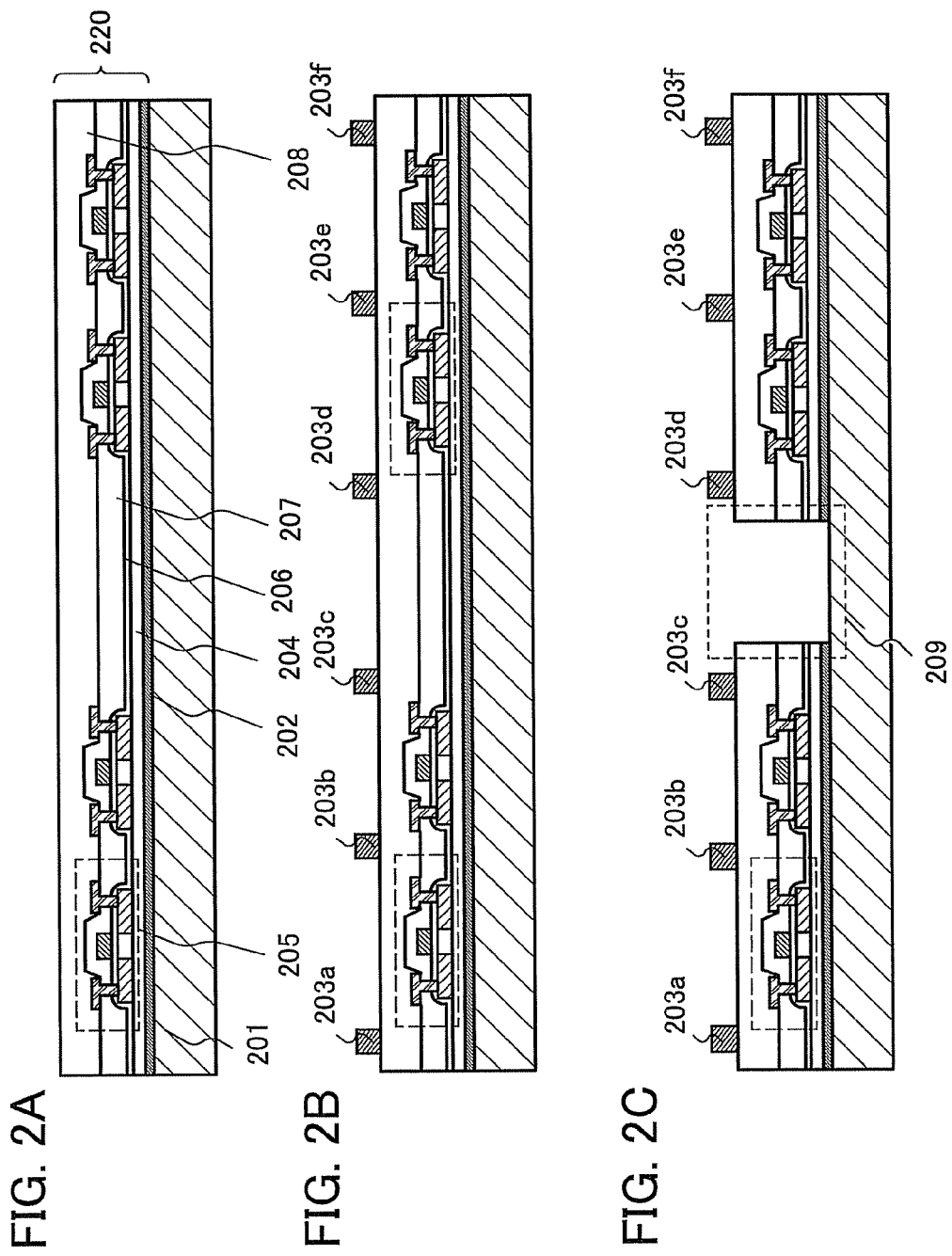

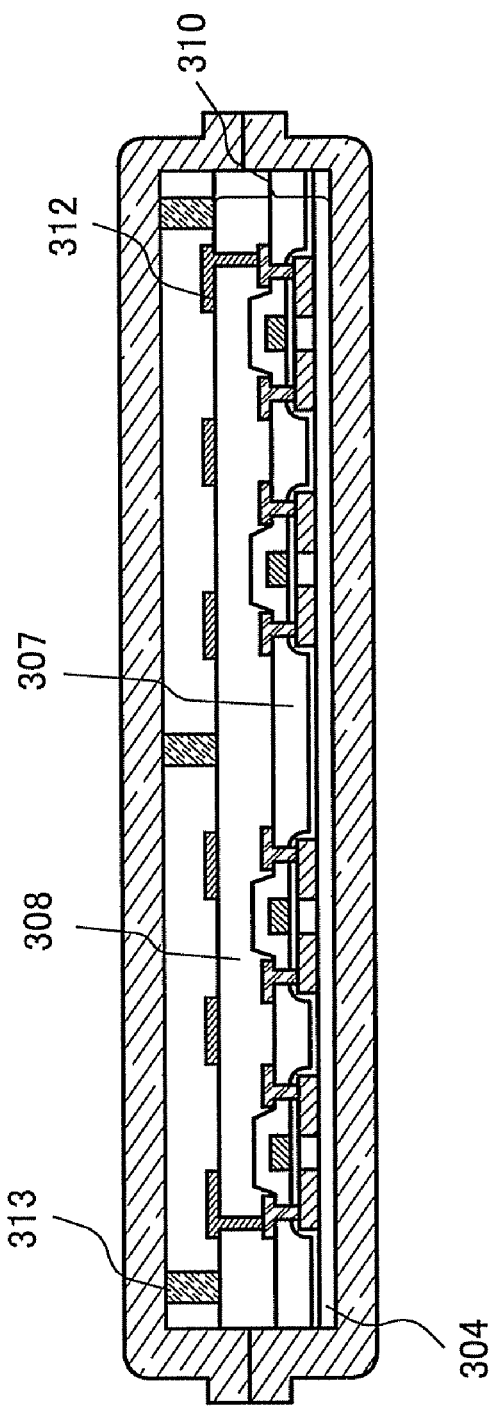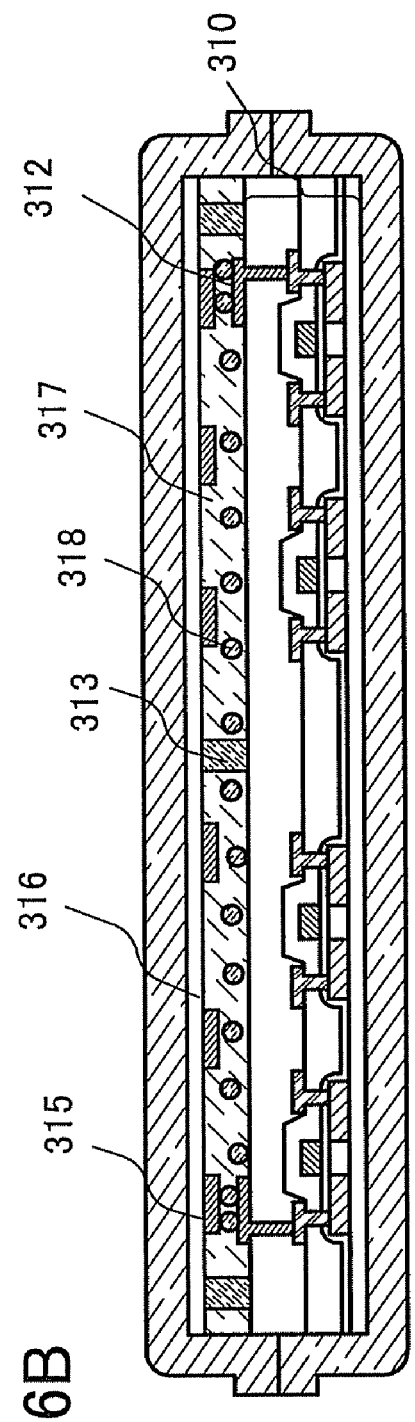

SEMICONDUCTOR DEVICE AND METHOD FOR MANUFACTURING SEMICONDUCTOR DEVICE

BACKGROUND OF THE INVENTION

1. Field of the Invention

The present invention relates to semiconductor devices and a method for manufacturing the semiconductor devices.

2. Description of the Related Art

In recent years, a semiconductor device, or the like using a semiconductor element formed over a rigid substrate such as a glass substrate has been actively developed for use in a display such as an LCD or an organic EL display, a photoelectric conversion element such as a photo sensor or a solar cell, or the like. Further, a semiconductor device which transmits and receives data without contact (also referred to as an RFID (radio frequency identification) tag, an ID tag, an IC tag, an IC chip, a wireless tag, an electronic tag, or a wireless chip) has been actively developed. Further, these days, flexible devices such as a film display and a semiconductor device embedded in paper have been required (Patent Document 1: Japanese Published Patent Application No. 2005-350823).

SUMMARY OF THE INVENTION

As described above, semiconductor devices have been widely used in a variety of fields. However, there has been a problem in that when a semiconductor device is used, impulse or stress is received by the semiconductor device and therefore a semiconductor element in the semiconductor device will be damaged.

Thus, an object of the present invention is to provide a semiconductor device having resistance to physical force from external and a method for manufacturing the semiconductor device.

To solve the aforementioned problems, one mode of the present invention includes an element layer including a transistor in which a channel is formed in a semiconductor layer and insulating layers as an upper layer and a lower layer of the transistor respectively, and a plurality of projecting members provided on a surface of the element layer. The longitudinal elastic modulus of the material for forming the plurality of projecting members is lower than that of the material of an insulating layer formed on the surface of the element layer.

Further, in another mode of the present invention, openings are formed in the element layer including a transistor in which a channel is formed in a semiconductor layer and insulating layers formed as an upper layer and a lower layer of the transistor respectively, and a plurality of projecting members are provided in the openings. The longitudinal elastic modulus of the material for forming the plurality of projecting members is higher than that of the materials of the insulating layers used for the element layer. The plurality of projecting members are formed so as to be higher than a surface the element layer.

The plurality of projecting members are preferably provided at intervals of from 2 to 200 μm, more preferably, from 50 to 150 μm.

By providing the plurality of projecting members over the element layers, external force applied to a semiconductor device can be reduced if applied to the semiconductor device.

Note that "semiconductor device" in this specification refers to general devices which can function by using semiconductor characteristics.

An element layer in this specification refers to a layer provided with a plurality of CPUs (central processing units), memories, microprocessors, and the like by using at least a semiconductor element typified by a thin film transistor (TFT). Further, the element layer may include an antenna or a microstructure.

By implementing the present invention, a semiconductor device having resistance to physical force from external can be provided and also a highly reliable semiconductor device can be provided.

BRIEF DESCRIPTION OF THE DRAWINGS

FIGS. 2A to 2C are views showing an example of a method for manufacturing a semiconductor device of the present invention.

FIGS. 6A and 6B are views each showing an example of a semiconductor device of the present invention.

DETAILED DESCRIPTION OF THE INVENTION

Figure 1A:
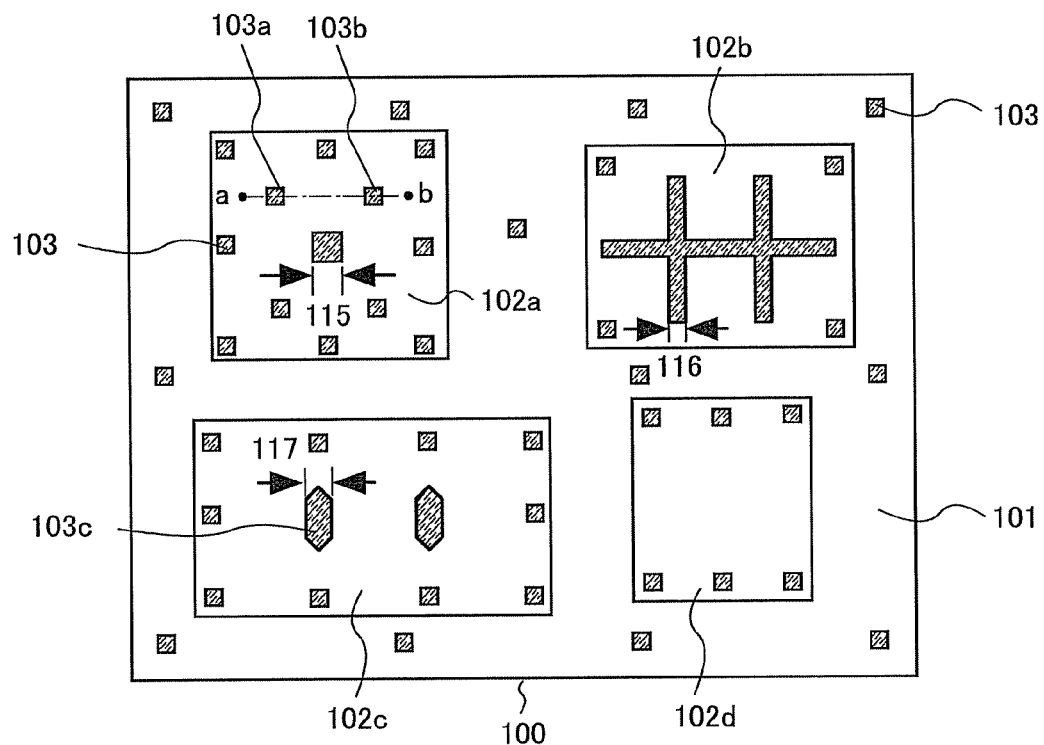
FIGS. 1A and 1B are views showing an example of a semiconductor device of the present invention.

Hereinafter, embodiment modes of the present invention will be described with reference to the accompanying drawings. However, the present invention can be carried out in many different modes, and it will be easily understood by those skilled in the art that various changes and modifications can be made to the modes and their details without departing from the spirit and scope of the present invention. Therefore, the present invention should not be construed as being limited to the description in the following embodiment modes. Note that like reference numerals refer to like parts throughout the drawings in some cases in the structure of the present invention, which is described below.

Embodiment Mode 1

In this embodiment mode, a structural example of a semiconductor device of the present invention is described with reference to drawings.

FIG. 1A shows a top structure of a semiconductor device 100 of this embodiment mode. The semiconductor device 100 includes blocks 102a to 102d provided over a substrate 101. A projecting member 103 is provided between blocks and projecting members are also provided in each of the blocks. In the case of taking a block 102a as an example, the projecting member 103 is provided in the periphery of the block 102a and projecting members are also provided in the block 102a.

The blocks 102a to 102d each include an element such as a transistor or a diode. As the diode, a variety of diodes such as a variable capacitance diode, a Schottky diode, and a tunnel diode can be applied.

Intervals at which a plurality of projecting members 103 are provided may each be set in a range of from 2 to 200 μm (preferably, from 50 to 150 μm). The plurality of projecting members 103 are preferably provided so that each interval therebetween is shorter than a curvature radius of the nib of a ballpoint pen or the like. For example, the interval may be set in a range of from 2 to 150 μm, desirably, from 2 to 100 μm, more desirably, from 10 to 100 μm in order to withstand pressing force by a pointed object such as a ballpoint pen. Further, the projecting members 103 are preferably formed so as not to overlap a channel formation region of a transistor. The projecting members 103 may be arranged so as to surround a transistor. Here, an interval at which projecting members are provided refers to a distance between the center of a projecting member and the center of a projecting member closest to the projecting member.

A width of the projecting member 103 (a length 115 shown by arrows in a block 102a, a length 116 shown by arrows in a block 102b, a length 117 shown by arrows in a block 102c, in FIG. 1A) is desirably equal to or longer than 1 μm. In view of a distortion of the projecting member 103, a width of the projecting member is desirably equal to or longer than 10 μm, more desirably equal to or longer than 50 μm; however, it is also allowed that projecting members each having a width of equal to or longer than 10 μm are provided at shorter intervals in order to secure an element region.

If external force is applied to the semiconductor device 100 provided with the projecting members 103, although the semiconductor device 100 is internally stressed, the stress is dispersed on the projecting members 103. Thus, by providing the projecting members 103, stress can be prevented from being applied to an element such as a transistor provided in a block.

Figure 1B:
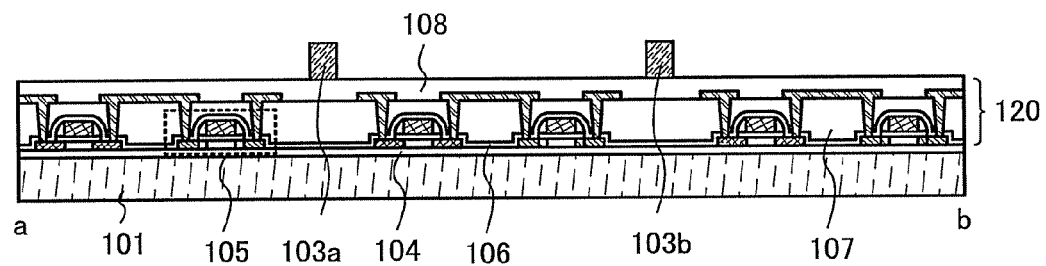

Next, FIG. 1B shows a schematic view of a cross-sectional structure taken along line a-b in FIG. 1A.

Here, a case where the projecting members 103 are provided over an element layer 120 formed of insulating films 106 to 108 and a transistor 105, which is over an insulating film 104 (also referred to as a first insulating layer), is shown. In more specific, the transistor 105 is provided over the substrate 101 with the insulating film 104 interposed therebetween, the insulating films 106 to 108 are provided so as to cover the transistor 105, and the projecting members 103a and 103b are provided over the insulating film 108.

As the substrate 101, a glass substrate, a plastic substrate, an SOI substrate, or the like can be used. A plastic substrate may be a film formed of polypropylene, polyester, vinyl, polyvinyl fluoride, polyvinyl chloride, or the like, paper of a fibrous material, a film stack of a base film (polyester, polyamide, an inorganic vapor deposition film, paper, or the like) and an adhesive synthetic resin film (an acrylic-based synthetic resin, an epoxy-based synthetic resin, or the like), or the like. Alternatively, a flexible metal substrate may be used. For example, a stainless steel substrate may be used.

As the transistor 105, for example, a thin film transistor (TFT), a field effect transistor (FET) over a semiconductor substrate such as a Si substrate, where the substrate is used as a channel, an organic TFT where an organic compound material is used for a channel region, or the like can be used. Further, any kind of block such as a CPU, a memory, or a microprocessor can be provided using the transistor 105. Here, an example where a CMOS circuit combining an n-type semiconductor and a p-type semiconductor is described. An impurity region (including a source region, a drain region, and an LDD region) is provided in a semiconductor film, and an insulating film (sidewall) is provided so as to be in contact with a side surface of a gate electrode. Although the example is shown where an LDD region is formed in a n-type semiconductor film and not in a p-type semiconductor film, it is needless to say that an LDD region may be formed in the p-type semiconductor film as well as in the n-type semiconductor film. By providing semiconductor films to have island shapes, even in the case where external force such as bending is applied to the semiconductor device, the semiconductor films are prevented from being stressed and thus being damaged, for example.

The insulating film 104 can be provided to have a single-layer structure or a stacked-layer structure of an insulating film containing oxygen or nitrogen such as silicon oxide ($SiO_x$), silicon nitride ($SiN_x$), silicon oxynitride ($SiO_xN_y$, where x>y), or silicon nitride oxide ($SiN_xO_y$, where x<y). In the case where the insulating film has a two-layer structure, a silicon nitride oxide film may be formed for a first layer, and a silicon oxynitride film may be formed for a second layer, for example. In the case where the insulating film has a three-layer structure instead of a two-layer structure, a silicon oxynitride film, a silicon nitride oxide film, and a silicon oxynitride film may be formed for a first layer, a second layer, and a third layer, respectively.

The insulating film 106 can be formed by a sputtering method, a plasma CVD method, or the like to have a single-layer structure or a stacked-layer structure of an insulating film containing oxide or nitride such as silicon oxide ($SiO_x$), silicon nitride ($SiN_x$), silicon oxynitride ($SiO_xN_y$, where x>y), TEOS (tetraethyl orthosilicate), or silicon nitride oxide ($SiN_xO_y$, where x<y).

The insulating films 107 and 108 can each be formed to have a single-layer structure of an insulating film containing oxygen or nitrogen, such as silicon oxide ($SiO_x$), silicon nitride ($SiN_x$), silicon oxynitride ($SiO_xN_y$, where x>y), or silicon nitride oxide ($SiN_xO_y$, where x>y); a film containing carbon such as DLC (diamond like carbon); an organic material such as epoxy, polyimide, polyamide, polyvinylphenol, benzocyclobutene, or acrylic; or a siloxane-based material, or a stacked-layer structure of any of the above.

The projecting members 103a and 103b are processed to have columnar shapes by photolithography and etching. Alternatively, the projecting members 103a and 103b can be processed to have columnar shapes by a droplet discharging method, an ink-jet method, a printing method, or the like.

Cross sections of the projecting members 103a and 103b (cross-section surface cut parallel to the substrate) may each be any shape such as a polygon or a circle. For example, such a tetragon as shown in the block 102a, such a shape as shown in the block 102b, or such a hexagon as shown in the block 102c, in FIG. 1A may be adopted. As shown in FIG. 1A, the projecting members 103a and 103b may be provided to have different cross sections over the same substrate. Further, the projecting members 103a and 103b are preferably formed to have the same height.

An interval at which the projecting members 103a and 103b are provided may be set in a range of from 2 to 200 μm (more preferably, from 50 to 150 μm). For example, the interval may be set in a range of from 2 to 150 μm, desirably, from 2 to 100 μm, more desirably, from 10 to 100 μm in order to withstand pressing force by a pointed object such as a ballpoint pen. Further, the projecting members 103a and 103b are preferably formed so as not to overlap a channel formation region of the transistor 105. The projecting members 103 may be arranged so as to surround the transistor.

A width of each of the projecting members 103a and 103b is desirably equal to or longer than 1 μm. In view of distortions of the projecting members 103, a width of the projecting member is desirably equal to or longer than 10 μm, more desirably, equal to or longer than 50 μm; however, it is also allowed that the projecting members each having a width of equal to or longer than 10 μm are provided at shorter intervals in order to secure an element region. For example, in the case where the cross sections of the projecting members 103 are circles, a diameter of each of the circles is desirably equal to or longer than 1 μm.

The longitudinal elastic modulus of the material of the projecting members 103a and 103b is lower than that of the material of the insulating film 108 (also referred to as a second insulating layer). Further, the longitudinal elastic modulus of the material of the projecting members 103a and 103b is preferably lower than that of the materials of the insulating film 106 and the insulating film 107. For example, an organic material such as a silicone resin, an organic siloxane resin, acrylic, polyethylene, vinyl acetate, vinyl ethylene acetate, polystyrene, polyurethane, polypropylene, polyvinyl fluoride, vinyl chloride, polybenzoxazole, a novolac resin, polyester, polyamide, or polyimide can be used. Longitudinal elastic modulus of the above-described main materials is described below: that of polystyrene is 2.7 to 4.2 GPa and that of a silicone resin is 160 to 370 MPa.

By using such a material as described above for the projecting members, an effect described below can be obtained. That is, external force applied to the semiconductor device is absorbed by the projecting members 103a and 103b and reduced and then applied to the element layer. The projecting members 103a and 103b formed of a material having a longitudinal elastic modulus lower than that of the material of the insulating film 108 are provided over the element layer, so that external force applied to the semiconductor device can be dispersed on each projecting member to prevent the element layer from being stressed.

The projecting members 103a and 103b may be provided between the blocks 102a to 102d as shown in FIG. 1A. For example, the projecting members 103a and 103b may be provided between the block 102a and the block 102b or between the block 102c and the block 102d.

With such a structure, if external force is applied to the semiconductor device, stress applied to the semiconductor device can be dispersed on the projecting members and thus stress is prevented from being applied to the transistor or the like. Further, the characteristic of an element such as the transistor can be prevented from being adversely affected. The element layer can be protected from external force or the like applied to the semiconductor device and the semiconductor device can be prevented from being damaged.

Note that by providing a conductive film (also referred to as an antenna layer) which functions as an antenna in the structure shown in FIGS. 1A and 1B, a semiconductor device which can communicate data without contact can also be manufactured. In that case, the conductive film which functions as an antenna can be provided by being formed over the second insulating layer. Then, the projecting member is provided in a portion where the conductive film which functions as an antenna is not provided. Note that the projecting member 103b is preferably formed to be higher than the conductive film.

Embodiment Mode 2

Figure 11A:
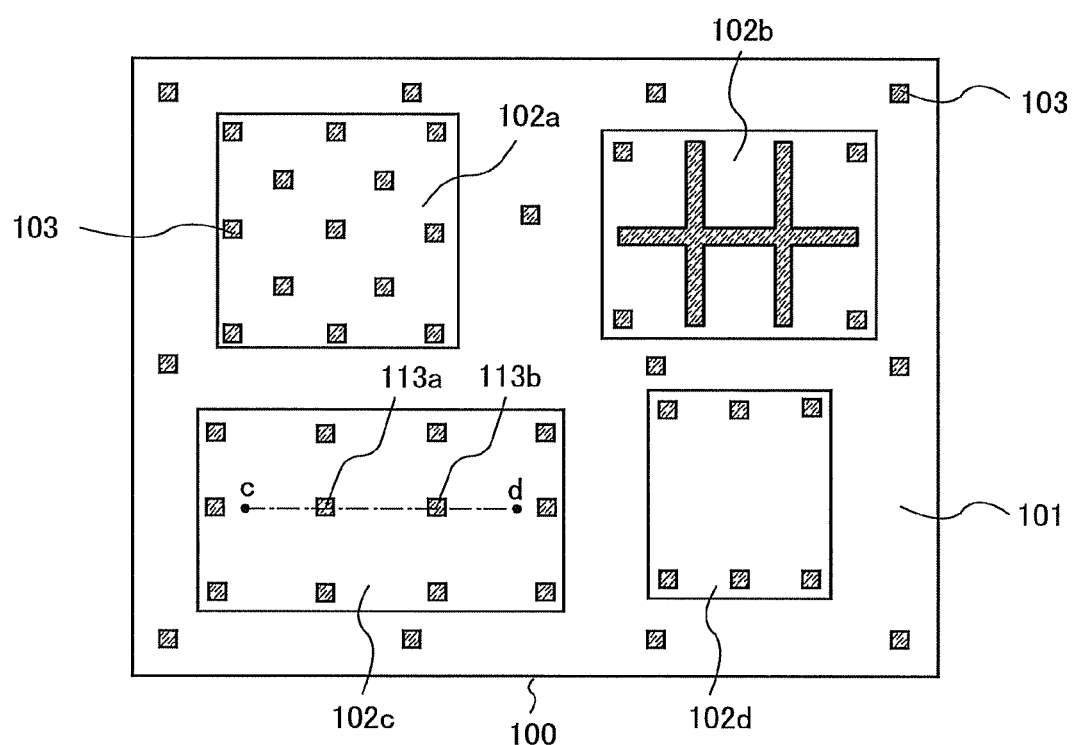
FIGS. 11A and 11B are views showing an example of a semiconductor device of the present invention.
Figure 11B:
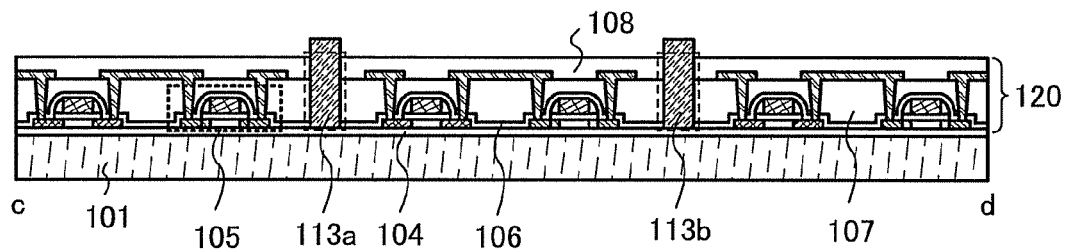

FIGS. 11A and 11B are views showing an example of a semiconductor device of this embodiment mode. This embodiment mode is similar to Embodiment Mode 1 except that openings are formed in an element layer, a plurality of projecting members are provided in the openings, and the longitudinal elastic modulus of the material of the plurality of projecting members is higher than that of the materials of a first insulating layer and a second insulating layer. A specific example of the element layer is similar to the element layer described in Embodiment Mode 1. Hereinafter, like reference numerals refer to like parts between the structure of this embodiment mode and the structure of Embodiment Mode 1, and description thereof is omitted.

First, all of the insulating films 104 to 108 of the element layer 120 are removed to form openings. Note that it is preferable that the insulating film 104 be not removed and the insulating films 106 to 108 be removed to form openings.

Projecting members 113a and 113b are provided in the openings formed in the element layer 120. The projecting members 113a and 113b are formed to have columnar shapes by photolithography and etching. Alternatively, the projecting members 113a and 113b can be formed to have columnar shapes by a droplet discharging method, an ink-jet method, a printing method, or the like.

Cross sections of the projecting members 113a and 113b may each be any shape such as a polygon or a circle. Such a shape as shown in the block 102b in FIG. 11A may be adopted. Further, the projecting members 113a and 113b are preferably formed to have the same height. By thus providing the projecting members 113a and 113b, stress applied to the semiconductor device can be dispersed on each projecting member.

An interval at which the projecting members 113a and 113b are provided is each preferably set in a range of from 10 to 200 μm (more preferably, 50 to 150 μm). Further, at least one transistor 105 is preferably formed between the projecting member 113a and the projecting member 113b.

A width of each of the projecting members 113a and 113b is desirably equal to or longer than 1 μm. In view of distortions of the projecting members 113a and 113b, a width of each of the projecting members 113a and 113b is desirably equal to or longer than 5 μm, more desirably equal to or longer than 10 μm; however, it is also allowed that the projecting members each having a width of equal to or longer than 1 μm are provided at shorter intervals in order to secure an element region. For example, in the case where the cross sections of the projecting members 113a and 113b are circles, a diameter of each of the circles is desirably equal to or longer than 1 μm.

The longitudinal elastic modulus of the material of the projecting members 113a and 113b is higher than that of the materials of the insulating film 104 (also referred to as a first insulating layer) and the insulating film 108 (also referred to as a second insulating layer). Further, the longitudinal elastic modulus of the material of the projecting members 113a and 113b is preferably lower than that of the materials of the insulating film 106 and the insulating film 107. For example, an element selected from nickel (Ni), molybdenum (Mo), tungsten (W), tantalum (Ta), chromium (Cr), aluminum (Al), copper (Cu), iron (Fe), or titanium (Ti), or an alloy containing a plurality of the above-described elements can be used. As a metal nitride, a tantalum nitride, a tungsten nitride, a molybdenum nitride, a titanium nitride, or the like can be used. As a metal oxide, a tantalum oxide, a titanium oxide, a molybdenum oxide, alumina, or the like can be used. Longitudinal elastic modulus of the above-described main materials is described below: that of nickel is 207 GPa, that of molybdenum is 324 GPa, that of tungsten is 345 GPa, that of tantalum is 186 GPa, and that of chromium is 248 GPa. A longitudinal elastic modulus of the material of the projecting members is, for example, equal to or higher than 150 GPa, desirably, equal to or higher than 200 GPa, more desirably, equal to or higher than 300 GPa.

By using such a material as described above for the projecting member formed in the element layer in which openings are formed, an effect described below can be obtained. That is, external force applied to the semiconductor device is applied to the projecting members 113a and 113b. Because openings are formed in the element layer and the projecting members 113a and 113b formed of a material having a longitudinal elastic modulus higher than that of the materials of the insulating film 104 and the insulating film 108 are provided in the openings, distortions can be smaller. Therefore, external force applied to the semiconductor device can be dispersed on each projecting member to prevent the element layer from being stressed.

In the case of using a material having a high longitudinal elastic modulus for the projecting members 113a and 113b, when external force is applied to the semiconductor device, distortions caused in the projecting members 113a and 113b are smaller than those caused in the projecting members 103a and 103b. Therefore, cross-sectional areas of the projecting members 113a and 113b (areas of cut surfaces of the projecting members cut parallel to the element layer) may be smaller than those of the projecting members 103a and 103b. Further, an interval at which the projecting members 113a and 113b may be longer than an interval at which the projecting members 103a and 103b are provided. By thus providing the projecting members 113a and 113b, stress applied to the semiconductor device can be dispersed on each projecting member.

The projecting members 113a and 113b may be provided between the blocks 102a to 102d as shown in FIG. 11A. For example, the projecting members 103a and 103b may be provided between the block 102a and the block 102b or between the block 102c and the block 102d.

With such a structure, if external force is applied to the semiconductor device, stress applied to the semiconductor device can be dispersed on the projecting members and thus stress is prevented from being applied to the transistor or the like. Further, the characteristic of an element such as the transistor is prevented from being adversely affected. The element layer can be protected from external force or the like applied to the semiconductor device and the semiconductor device can be prevented from being damaged.

Embodiment Mode 3

In this embodiment mode, an example of a method for manufacturing a semiconductor device of the present invention is described with reference to FIGS. 2A to 3F.

Here, an example where an element layer is provided over a substrate with a release layer interposed therebetween and then the element layer is separated from the substrate is described.

In this embodiment mode, an example where after an element layer including an element such as a transistor is provided over a rigid substrate such as a glass substrate, the element layer is separated from the rigid substrate by a release method and the element layer is provided over another substrate so that a semiconductor device is manufactured is described.

First, a release layer 202 is formed over a substrate 201 (also referred to as a first substrate), and an element layer 220 including an insulating film 204 (also referred to as a first insulating film), a thin film transistor 205 (also referred to as a TFT), an insulating film 207, a conductive film, and an insulating film 208 are formed over the release layer 202 (FIG. 2A). In specific, the thin film transistor 205 is formed over the release layer 202 with the insulating film 204 interposed therebetween, the insulating films 207 and 208 are formed so as to cover the thin film transistor 205, the conductive film is formed over the insulating film 207 so as to be connected to an impurity region of the thin film transistor 205, and the insulating film 208 is formed so as to cover the conductive film. Further, an insulating film may be formed between the substrate 201 and the release layer 202, as a base film. By providing the insulating film between the substrate 201 and the release layer 202, contamination from the substrate 201 to the release layer 202, or the like can be prevented.

Next, projecting members 203a to 203f are provided over the insulating film 208 (FIG. 2B). The projecting members 203a to 203f are formed to have columnar shapes by photolithography and etching. Alternatively, the projecting members 203a to 203f can be formed to have columnar shapes by a droplet discharging method, an ink-jet method, a printing method, or the like.

Cross sections of the projecting members 203a to 203f may each be any shape such as a polygon or a circle. Further, the projecting members 203a to 203f are preferably formed to have the same height.

A longitudinal elastic modulus of the material of the projecting members 203a to 203f is lower than that of the material of the insulating film 208 (also referred to as a second insulating layer). Further, the longitudinal elastic modulus of the material of the projecting members 203a to 203f is preferably lower than that of the materials of the insulating film 206 and the insulating film 207. For example, an organic material such as a silicone resin, an organic siloxane resin, acrylic, polyethylene, vinyl acetate, vinyl ethylene acetate, polystyrene, polyurethane, polypropylene, polyvinyl fluoride, vinyl chloride, polybenzoxazole, a novolac resin, polyester, polyamide, or polyimide can be used.

Intervals at which the projecting members 203a to 203f are provided are each preferably set in a range of from 2 to 200 μm (more preferably, from 50 to 150 μm). For example, each of the intervals may be set in a range of from 2 to 150 μm, desirably, from 2 to 100 μm, more desirably, from 10 to 100 μm in order to withstand pressing force by a pointed object such as the nib of a ballpoint pen. Further, the projecting members 203a to 203f are preferably formed so as not to overlap a channel formation region of the thin film transistor 205.

A width of each of the projecting members 203a to 203f is desirably equal to or longer than 1 μm. In view of distortions of the projecting members 203a to 203f, a width of each of the projecting members 203a to 203f is desirably equal to or longer than 10 μm, more desirably, equal to or longer than 50 μm; however, it is also allowed that the projecting members each having a width of equal to or longer than 10 μm are provided at shorter intervals in order to secure an element region. For example, in the case where the cross sections of the projecting members 203a to 203f are circles, a diameter of each of the circles is desirably equal to or longer than 1 μm.

Next, the element layer 220 is released from the substrate 201. Here, the element layer 220 is selectively irradiated with a laser beam to form an opening 209 for dividing an element and then the element layer 220 is released from the substrate 201 by physical force. As for another release method, it is also allowed that the opening 209 is formed to expose the release layer 202 and then an etchant is introduced into the opening 209 to remove the release layer 202, after that, releasing is performed (FIG. 2C). In this case, the release layer 202 may be entirely removed or removed so as to be partially left by controlling an etching condition. Here, the release layer 202 is removed so as to be partially left. By removing the release layer 202 so as to be partially left, the element layer 220 is not completely released from the substrate 201 so that the element layer 220 and the substrate 201 can be prevented from separating each other even after the release layer 202 is removed. Further, reduction in etching time or usage of the etchant can be achieved and thus operating efficiency can be improved and cost reduction can be achieved.

Figure 3D:
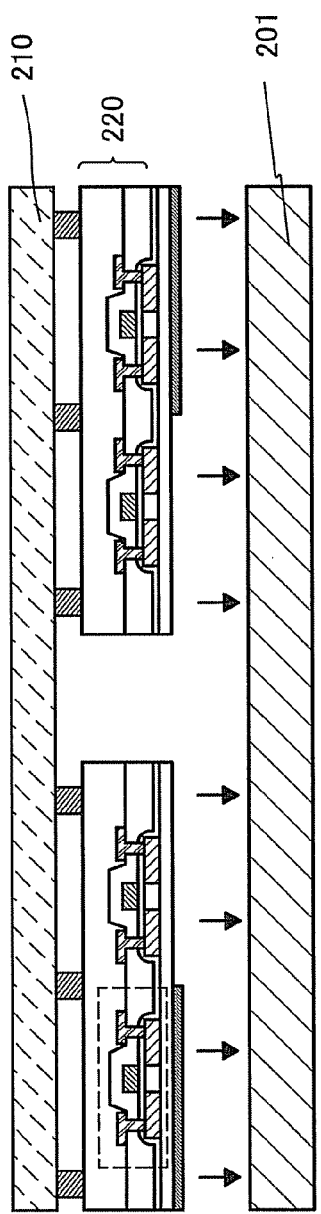
FIGS. 3D to 3F are views showing an example of a method for manufacturing a semiconductor device of the present invention.

Next, a film 210 (also referred to as a second substrate) including an adhesive layer (also referred to as a first adhesive layer) is attached to surfaces of the projecting members 203a to 203f, and the element layer 220 is released from the substrate 201 (FIG. 3D). As the adhesive layer, a material which has high adhesion to adhesive layers of the projecting members 203a to 203f is selected. Because the substrate 201 and the insulating film 204 in the element layer 220 are partially in contact with each other by the remaining release layer here, the element layer 220 is released from the substrate 201 by a physical means.

A surface of the element layer 220, which is released from the substrate 201, is adhered to a substrate 210a to release the film 210. After that, a substrate 210b (also referred to as a third substrate) is adhered to a surface of the element layer 220, from which the film 210 is released.

Figure 3E:
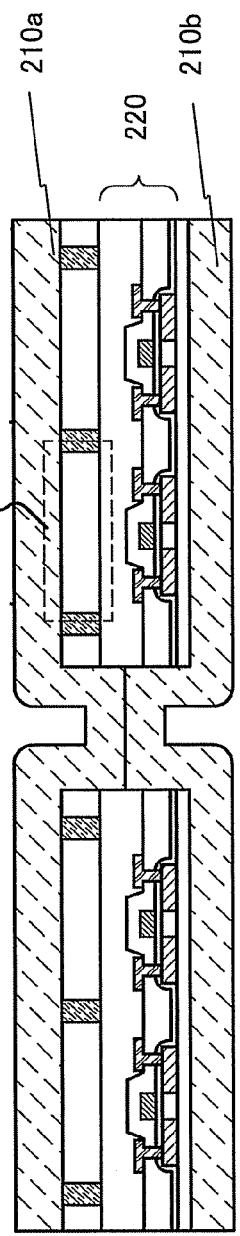

Next, the element layer 220 provided with the projecting members 203a to 203f is sealed with the substrate 210a and the substrate 210b (FIG. 3E). Here, a space 212 surrounded by the insulating film 208, the projecting members 203a to 203f, and the substrate 210a is formed. By sealing the element layer 220 provided with the projecting members 203a to 203f with the substrate 210a and the substrate 210b, mechanical strength can be improved.

Figure 3F:
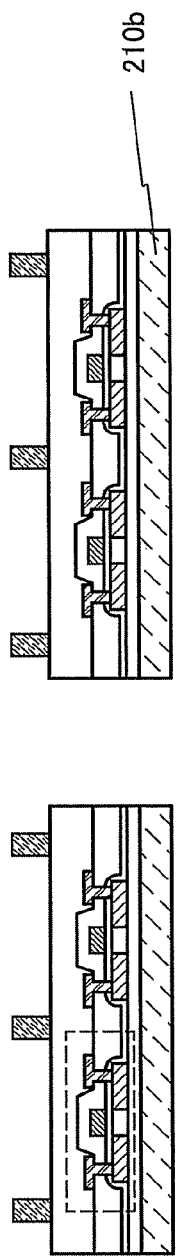

Through the above-described steps, a semiconductor device can be manufactured. Note that a semiconductor device may be completed without sealing the element layer 220 with the substrate 210a and the substrate 210b after the substrate 210b is provided (FIG. 3F). Materials or the like used in the above-described steps will be specifically described below.

As the substrate 201, a glass substrate, a quartz substrate, a metal substrate, a semiconductor substrate, or a stainless steel substrate having a surface on which an insulating film is formed, or the like can be used. Such a substrate has no significant limitation on its area or its shape. Thus, in a case of using a substrate which is a rectangular shape having a side length of 1 meter or longer for example, productivity can be significantly increased. Even in a case of using a quartz substrate of which cost is expensive, by utilizing the quartz substrate repeatedly, a semiconductor device can be manufactured at low cost.

In the case of providing an insulating film as a base film between the substrate 201 and the release layer 202, the insulating film can have a single-layer structure or a stacked-layer structure of an insulating film containing oxygen or nitrogen such as silicon oxide ($SiO_x$), silicon nitride ($SiN_x$), silicon oxynitride ($SiO_xN_y$, where x>y), or silicon nitride oxide ($SiN_xO_y$, where x>y), by a sputtering method, a variety of CVD methods such as a plasma CVD method, or the like.

As the release layer 202, a metal film, a stacked-layer structure of a metal film and a metal oxide film, a semiconductor film such as Si, a silicon oxide film, or the like can be used. The metal film is formed to have a single-layer structure or a stacked-layer structure of a film formed of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), and iridium (Ir), or an alloy material or a compound material including any of the above elements as its main component. The film formed of any of the above-described materials can be formed by a sputtering method, a variety of CVD methods such as a plasma CVD method, or the like. As the stacked-layer structure of a metal film and a metal oxide film, after the above-described metal film is formed, an oxide film of the metal film can be formed on a surface of the metal film by performing plasma treatment in an oxygen atmosphere or heat treatment in an oxygen atmosphere. For example, in the case of providing a tungsten film by a sputtering method as the metal film, plasma treatment is performed on the tungsten film so that a metal oxide film formed of tungsten oxide can be formed on a surface of the tungsten film. Instead of the metal oxide film, a metal nitride or a metal oxynitride may be used. In this case, the metal film may be subjected to plasma treatment or heat treatment in a nitrogen atmosphere or an $N_2O$ atmosphere. Alternatively, it is also allowed that sputtering is performed using a metal film as a target in an oxygen atmosphere to provide a metal oxide film on a surface of the metal film. In this case, the metal film and the metal oxide film can be formed of different metal elements. Note that these methods also allow metal nitride or metal oxynitride to be formed over the metal film by sputtering in a nitrogen atmosphere or an atmosphere containing nitrogen and oxygen.

The element layer 220 includes at least the insulating film 204, the thin film transistor 205, the insulating film 207, and the insulating film 208. Any kind of integrated circuit such as a CPU, a memory, or a microprocessor can be provided using the element layer 220. Further, the element layer 220 may include an antenna in addition to the thin film transistor 205 as described above. For example, an integrated circuit including thin film transistors operates using an AC voltage generated in the antenna and can transmit data to a reader/writer by modulating the AC voltage applied to the antenna. Note that the antenna may be formed together with the thin film transistor as described above or may be formed separately from the thin film transistor and then electrically connected to the thin film transistor.

The insulating film 204 can be formed by a sputtering method, a plasma CVD method, or the like to have a two-layer structure of any of insulating films containing oxygen or nitrogen, such as silicon oxide ($SiO_x$), silicon nitride ($SiN_x$), silicon oxynitride ($SiO_xN_y$, where x>y), and silicon nitride oxide ($SiN_xO_y$, where x<y). In that case, a silicon nitride oxide film may be formed for a first layer, and a silicon oxynitride film may be formed for a second layer. Alternatively, the insulating film 204 can be formed to have a three-layer structure. In that case, a silicon oxynitride film, a silicon nitride oxide film, and a silicon oxynitride film may be formed for a first layer, a second layer, and a third layer, respectively.

The thin film transistor 205 may have any structure. For example, an impurity region (including a source region, a drain region, and an LDD region) may be formed. The thin film transistor 205 may be a p-channel transistor, an n-channel transistor, or a CMOS circuit combining an n-type semiconductor and a p-type semiconductor. Further, an insulating film (sidewall) may be formed so as to be in contact with a side surface of a gate electrode provided above the semiconductor film, and a silicide layer formed of nickel, molybdenum, cobalt, or the like may be formed for one or both of a gate electrode, and source and drain regions. As the semiconductor in the thin film transistor 205, amorphous semiconductor or a crystalline semiconductor can be used. In the case of using a thin film transistor having more excellent characteristics, a crystalline semiconductor film is formed by crystallization by a crystallization method (such as a laser crystallization method, a thermal crystallization method using an RTA or an annealing furnace, or a method combining a laser crystallization method and a thermal crystallization method using a metal element for promoting crystallization, or the like.

The insulating film 206 can be formed by a sputtering method, a plasma CVD method, or the like to have a single-layer structure or a stacked-layer structure of an insulating film containing oxygen or nitrogen such as silicon oxide ($SiO_x$), silicon nitride ($SiN_x$), silicon oxynitride ($SiO_xN_y$, where x>y), TEOS (tetraethyl orthosilicate), or silicon nitride oxide ($SiN_xO_y$, where x<y).

The insulating film 207 and the insulating film 208 can be formed using the same material as those described above. In particular, in a case of using an organic material such as epoxy, polyimide, polyamide, polyvinyl alcohol, benzocyclobutene, or acrylic, a siloxane material, or the like, the insulating film 207 and the insulating film 208 can be formed by a spin coating method, a droplet discharging method, a printing method, or the like; therefore, planarization or reduction in process time can be achieved. The insulating films 207 and 208 may be formed using the same material or different materials.

The conductive film can be formed to have a single-layer structure of an element selected from Al, Ni, C, W, Mo, Ti, Pt, Cu, Ta, Au, or Mn, or an alloy containing a plurality of the above-described elements, or a stacked-layer structure of any of the above. For example, as a conductive film formed of an alloy containing a plurality of the above-described elements, an Al alloy containing C and Ti (Al—Ti—C), an Al alloy containing Ni (Al—Ni), an Al alloy containing C and Ni (Al—Ni—C), an Al alloy containing C and Mn (Al—Mn—C), or the like may be used.

As the etchant, a gas or a liquid containing halide can be used. For example, $ClF_3$ (chlorine trifluoride), $NF_3$ (nitrogen trifluoride), $BrF_3$ (bromine trifluoride), or HF (hydrogen fluoride) can be used. Note that in the case of using HF, a silicon oxide film is used as the release layer.

As the substrates 210a and 210b, flexible films (sheet films) can be used. For example, a film formed of polypropylene, polyester, vinyl, polyvinyl fluoride, vinyl chloride, or the like, paper of a fibrous material, a film stack of a base film (polyester, polyamide, an inorganic vapor deposition film, paper, or the like) and an adhesive synthetic resin film (an acrylic-based synthetic resin, an epoxy-based synthetic resin, or the like), or the like can be used. Further, such a film is attached to a body to be processed by heat treatment and pressure treatment. When the heat treatment and the pressure treatment are performed, an adhesive layer provided on the outermost surface of the film or a layer (not an adhesive layer) provided on the outermost layer is melted by heat treatment and bonded by being applied with pressure. Note that the element layer may be sealed with the film and the substrate.

Note that in this embodiment mode, a method in which after an element layer is provided over a rigid substrate such as a glass substrate, the element layer is released and provided over a substrate is described as a method for manufacturing a semiconductor device; however, the method for manufacturing a semiconductor device of the present invention is not limited to this. For example, after an element layer is formed over a semiconductor substrate such as a glass substrate or Si without a release layer interposed therebetween, the semiconductor substrate such as a glass substrate or Si may be thinned by grinding treatment or polishing treatment. In this case, a thin semiconductor device can be manufactured even if releasing is not performed. Further, while an example where a thin film transistor is provided as an element which is provided in an integrated circuit is described, it is also allowed that a projecting member is provided between a diode, a capacitor, and the like, similarly, even in the case of providing the diode, the capacitor, and the like.

Embodiment Mode 4

FIGS. 4A to 5F are cross-sectional views for showing an example of a method for manufacturing a semiconductor device of this embodiment mode. This embodiment mode is similar to Embodiment Mode 3 except that an opening is formed in an element layer, a plurality of projecting members are provided in the opening, and a longitudinal elastic modulus of the material of the plurality of projecting members is higher than that of the materials of a first insulating layer and a second insulating layer. The specific example of the method for manufacturing an element layer is similar to the method for manufacturing an element layer, which is described in Embodiment Mode 3. Hereinafter, like reference numerals refer to like parts between the manufacturing method of this embodiment mode and the manufacturing method of Embodiment Mode 3, and description thereof is omitted.

Figure 4A:
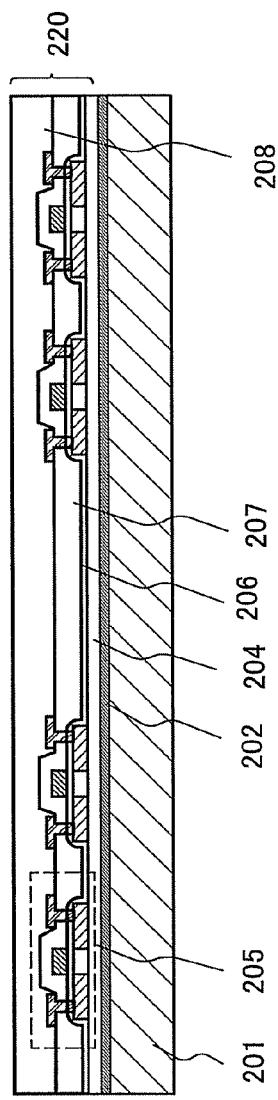
FIGS. 4A to 4C are views showing an example of a method for manufacturing a semiconductor device of the present invention.

First, a release layer 202 is formed over a substrate 201, and an element layer 220 including an insulating film 204 (also referred to as a first insulating layer), a thin film transistor 205, an insulating film 207, a conductive film, and an insulating film 208 (also referred to as a second insulating layer) is formed over the release layer 202 (FIG. 4A).

Figure 4B:
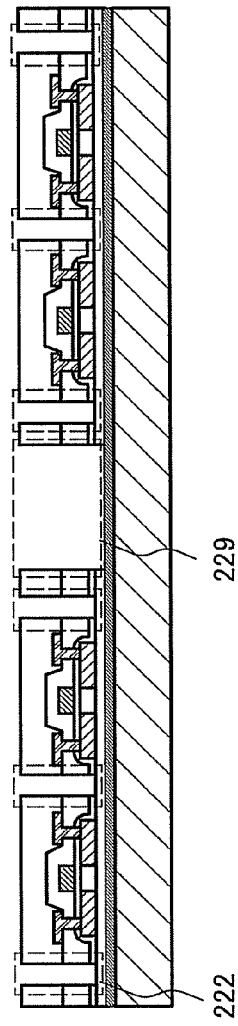

Next, the insulating films 206, 207, and 208 are selectively removed to form openings 222, in which projecting members are provided, in the element layer 220 (FIG. 4B). The openings 222 can be formed by a photolithography method or irradiation with a laser beam. Note that in a case of providing an opening 229 for dividing an element, the opening 229 can be formed by selectively removing an exposed portion of the insulating film 204.

Figure 4C:
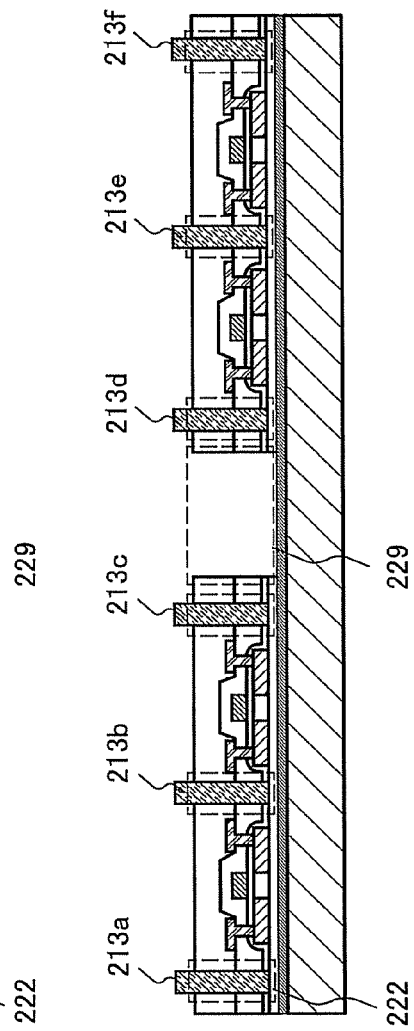
Figure 5D:
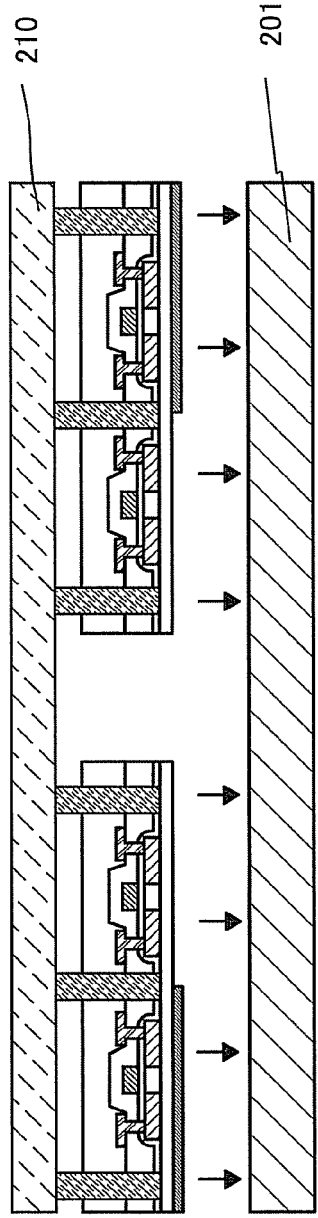
FIGS. 5D to 5F are views showing an example of a method for manufacturing a semiconductor device of the present invention.
Figure 5E:
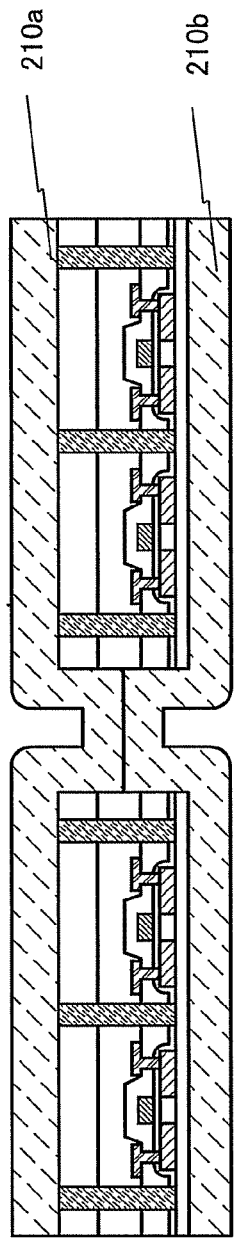
Figure 5F:
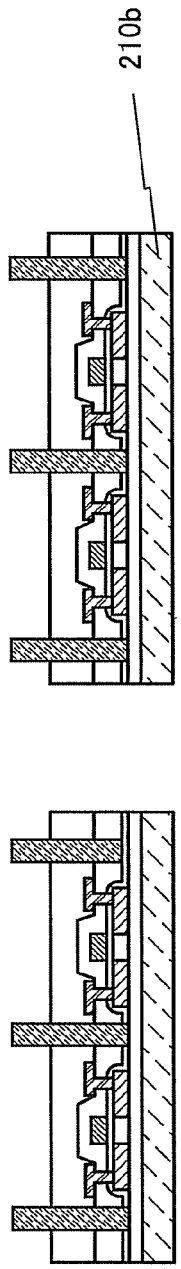

Next, projecting members 213a to 213f are provided in the openings 222 (FIG. 4C). The projecting members 213a to 213f are formed to have columnar shapes by photolithography and etching. Note that the projecting members 213a to 213f may be formed to have columnar shapes by a droplet discharging method, an ink-jet method, a printing method, or the like. In the case where an opening is formed in the element layer by selectively removing the insulating films 206, 207, and 208, the bottoms of the plurality of projecting members are in contact with the insulating film 204.

Intervals at which the projecting members 213a to 213f are provided are each preferably set in a range of from 10 to 200 µm (more preferably, 50 to 150 µm). For example, each of the intervals may be set in a range of from 2 to 150 µm, desirably, 2 to 100 µm, more desirably, 10 to 100 µm in order to withstand pressing force by a pointed object such as a ballpoint pen. Note that the projecting members 213a to 213f are provided so as to be higher than a surface of the element layer 220. In this case, an opening is formed in the element layer, and a longitudinal elastic modulus of the material of the projecting members 213a to 213f is higher than that of the materials of the insulating film 204 and the insulating film 208. Further, the longitudinal elastic modulus of the material of the projecting members 213a to 213f is preferably higher than that of the materials of the insulating film 206 and the insulating film 207. For example, an element selected from nickel (Ni), molybdenum (Mo), tungsten (W), tantalum (Ta), chromium (Cr), or aluminum (Al), or an alloy containing a plurality of the above-described elements can be used. As a metal nitride, a tantalum nitride, a tungsten nitride, a molybdenum nitride, a titanium nitride, or the like can be used. As a metal oxide, a tantalum oxide, a titanium oxide, a molybdenum oxide, alumina, or the like can be used.

A width of each of the projecting members 213a to 213f is desirably equal to or longer than 1 μm. In view of distortions of the projecting members 213a to 213f, a length of each of the projecting members 213a to 213f is desirably equal to or longer than 5 μm, more desirably equal to or longer than 10 μm; however, it is also allowed that projecting members each having a width of equal to or longer than 1 μm are provided at shorter intervals in order to secure an element region. For example, in the case where the cross sections of the projecting members 213a to 213f are circles, a diameter of each of the circles is desirably equal to or longer than 1 μm.

Cross sections of the projecting members 213a to 213f may each be any shape such as a polygon or a circle. Further, the projecting members 213a to 213f are preferably formed to have the same height. In the case of using a material having a high longitudinal elastic modulus for the projecting members 213a to 213f, when external force is applied to the semiconductor device, distortions caused in the projecting members 213a to 213f are smaller, and thus a transistor is prevented from being stressed. Therefore, cross-sectional areas of the projecting members 213a to 213f may be smaller than those of the projecting members 203a to 203f. Further, each of the intervals at which the projecting members 213a to 213f are provided may be longer than each of the intervals at which the projecting members 203a to 203f are provided. By thus providing the projecting members 213a to 213f, stress applied to the semiconductor device can be dispersed on each projecting member.

After that, steps similar to those described in FIGS. 3D and 3E are performed to complete the semiconductor device. By using the method shown in FIG. 2C, if the openings 222 and the opening 229 are formed simultaneously, a manufacturing process can be simplified. Further, by providing the projecting members so as to penetrate the element layer 220, if external force is applied to the semiconductor device, stress applied to the semiconductor device can be dispersed on the projecting members, and thus stress is prevented from being applied to a semiconductor element provided in an area other than the projecting members. Accordingly, a thin film transistor or the like can be effectively prevented from being damaged.

Embodiment Mode 5

In this embodiment mode, an example of a method for manufacturing a semiconductor device in any of the above-described embodiment modes, which can communicate data without contact by being provided with an antenna, is described. In general, a semiconductor device which can communicate data without contact is also referred to as an RFID (radio frequency identification) tag (also referred to as an IC tag, an IC chip, an RF (radio frequency) tag, a wireless tag, an electronic tag, or a wireless chip).

In general, a semiconductor device which can communicate data without contact (hereinafter also referred to as a wireless tag) includes an integrated circuit and an antenna and can communicate data without contact with an external device (reader/writer) through the antenna. Thus, by being provided with a conductive film which functions as an antenna, a semiconductor device which can communicate data without contact can be manufactured. For example, the semiconductor device 100 shown in FIGS. 1A and 1B can be provided with a conductive film which functions as an antenna. In this case, the semiconductor device 100 includes, for example, at least one of a power supply circuit, a clock generation circuit, a demodulation circuit, a modulation circuit, a memory circuit, or a control circuit which controls any other circuit. Next, a specific structural example where an antenna is provided is shown in FIGS. 6A and 6B.

FIG. 6A shows an example where conductive films 312 which function as antennas (also referred to as antenna layers) are formed over an element layer 310 and projecting members 313 are provided over portions over which the conductive films 312 are not formed. The projecting members 313 are preferably formed so as to be higher than the conductive films 312. Note that an insulating film 308 and the projecting members 313 correspond to the insulating film 108 and the projecting members 103 in Embodiment Mode 1, respectively.

The projecting members 313 are formed to have columnar shapes by photolithography and etching. Alternatively, the projecting members 313 may be formed to have columnar shapes by a droplet discharging method, an ink-jet method, a printing method, or the like.

Cross sections of the projecting members 313 may each be any shape such as a polygon or a circle. For example, such a shape as shown in the block 102b in FIG. 1A may be adopted. Further, the projecting members 313 are preferably formed to have the same height.

Intervals at which the projecting members 313 are provided are each preferably set in a range of from 10 to 200 μm (more preferably, 50 to 150 μm). For example, the intervals may each be set in a range of from 2 to 150 μm, desirably, 2 to 100 μm, more desirably, 10 to 100 μm in order to withstand pressing force by a pointed object such as the nib of a ball-point pen. Further, the projecting members 313 are preferably formed so as not to overlap a channel formation region of a transistor. The projecting members 313 may be arranged so as to surround the transistor.

A width of each of the projecting members 313 is desirably equal to or longer than 1 μm. In view of distortions of the projecting members 313, a width of the projecting member is desirably equal to or longer than 10 μm, more desirably equal to or longer than 50 μm; however, it is also allowed that the projecting members each having a width of equal to or longer than 10 μm are provided at shorter intervals in order to secure an element region. For example, in the case where the cross sections of the projecting members 313 (cut surfaces of the projecting members cut parallel to the element layer) are circles, a diameter of each of the circles is desirably equal to or longer than 1 μm.

A longitudinal elastic modulus of the material of the projecting members 313 is lower than that of the material of the insulating film 308 (also referred to as a second insulating layer). For example, an organic material such as a silicone resin, an organic siloxane resin, acrylic, polyethylene, vinyl acetate, vinyl ethylene acetate, polystyrene, polyurethane, polypropylene, polyvinyl fluoride, vinyl chloride, polybenzoxazole, a novolac resin, polyester, polyamide, or polyimide can be used.

By thus providing the projecting members 313, external force applied to the semiconductor device can be dispersed on each projecting member.

The conductive film 312 can be formed using a conductive material including one or a plurality of metals such as copper (Cu), aluminum (Al), silver (Ag), gold (Au), chromium (Cr), molybdenum (Mo), titanium (Ti), tantalum (Ta), tungsten (W), and nickel (Ni), and a metal compound. The insulating film can be formed to have a single-layer structure of an insulating film containing oxygen or nitrogen such as silicon oxide, silicon nitride, silicon oxynitride, or silicon nitride oxide; a film containing carbon such as DLC (diamond like carbon); an organic material such as epoxy, polyimide, polyamide, polyvinylphenol, benzocyclobutene, or acrylic; or a siloxane-based material, or a stacked-layer structure of any of the above.

Note that it is also allowed that the conductive films 312 which function as antennas are formed over the element layer 310, an opening is formed in the element layer 310 except portions where the conductive films 312 are provided, and the projecting members formed of a material having a longitudinal elastic modulus higher than that of the materials of an insulating film 304 (also referred to as a first insulating layer) and the insulating film 308 (also referred to as a second insulating layer) are provided in the opening. With such a structure, a semiconductor device which can communicate data without contact may be manufactured.

FIG. 6B shows an example where the conductive films 312 which function as antennas are formed over the element layer 310, the projecting members 313 formed of a material having a longitudinal elastic modulus lower than that of the material of the insulating film 308 (also referred to as a second insulating layer) are provided over portions over which the conductive films 312 are not formed, a substrate 316 provided with conductive films 315 (also referred to as antenna layers) which function as antennas is attached to the element layer 310 over which the projecting members 313 are provided, and the conductive films 315 are electrically connected to the conductive films 312. In this case, the element layer 310 is formed separately from the substrate 316 provided with the conductive films 314 which function as antennas. Further, the conductive films 312 provided over the insulating film 308 are electrically connected to the conductive films 315 which function as antennas through conductive particles 318 included in an adhesive resin 317.

Note that it is also allowed that the conductive films 312 which function as antennas are formed over the element layer 310, an opening is formed in the element layer 310, the projecting members formed of a material having a longitudinal elastic modulus higher than that of the materials of the insulating film 304 and the insulating film 308 are provided in the opening, the substrate 316 provided with the conductive films 315 which function as antennas is attached to the element layer 310 over which the projecting members 313 are provided, and the conductive films 315 are electrically connected to the conductive films 312, so that a semiconductor device which can communicate data without contact is manufactured.

Thus, as for the antennas, the conductive films 312 which function as antennas may be directly formed over the element layer 310, or the conductive films 312 which function as antennas may be separately formed over an antenna substrate and then attached to the element layer 310.

While the projecting members 313 are provided over the element layer 310 in FIG. 6B, the semiconductor device of the present invention is not limited to this. The projecting members 313 may be provided over the antenna substrate.

Embodiment Mode 6

Next, application examples of a semiconductor device which can communicate data without contact are described with reference to FIGS. 7A to 7C.

Figure 7A:
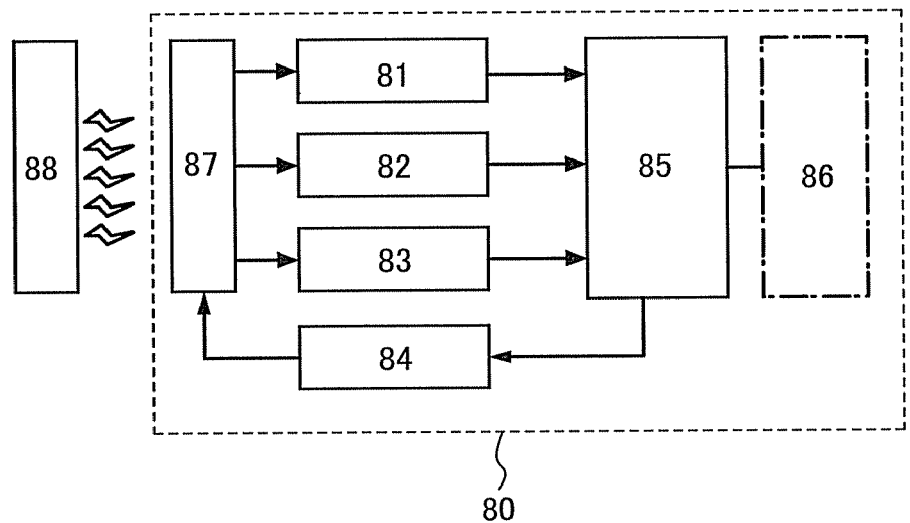
FIGS. 7A to 7C are diagrams each showing an application example of a semiconductor device of the present invention.
Figure 7B:
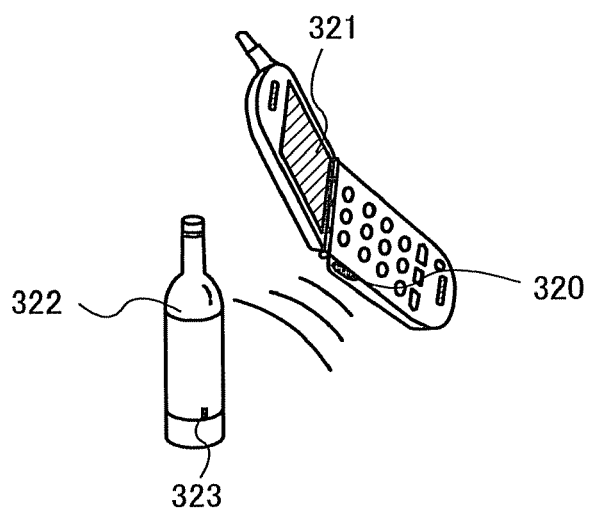
Figure 7C:
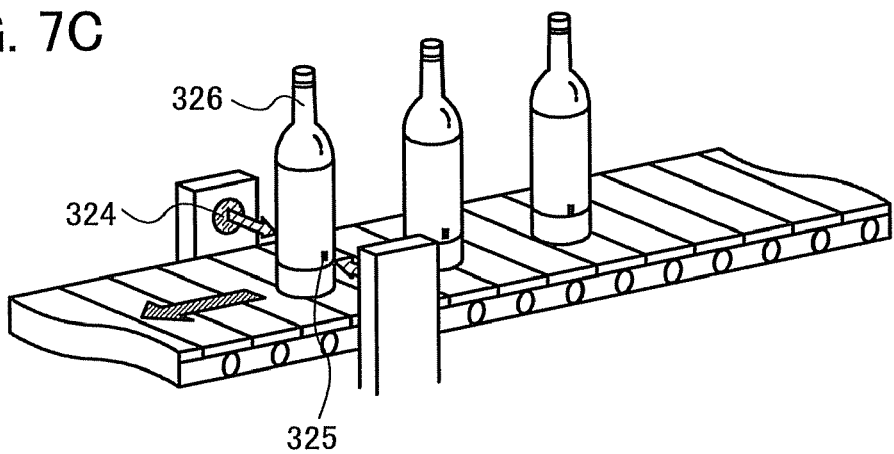

A wireless tag 80 has a function of communicating data without contact and includes a power supply circuit 81, a clock generation circuit 82, a data demodulation circuit 83, a data modulation circuit 84, a control circuit 85 which controls any other circuit, a memory circuit 86, and an antenna 87 (FIG. 7A). Note that the number of memory circuit is not limited to one and a plurality of memory circuits may be provided. For a memory circuit, an SRAM, a flash memory, a ROM, an FeRAM, a memory element portion for which an organic compound layer, or the like is used can be used.

A signal transmitted as a radio wave from a reader/writer 88 generates a power supply voltage using an AC electric signal by electromagnetic induction in the antenna 87 and supplies the power supply voltage to each circuit with the use of a power supply wiring. The clock generation circuit 82 generates a variety of clock signals based on the AC signal inputted from the antenna 87 and supplies the variety of signals to the control circuit 85. The demodulation circuit 83 demodulates the AC electric signal and supplies the demodulated AC electric signal to the control circuit 85. The control circuit 85 performs a variety of arithmetic processings in accordance with the inputted signal. The memory circuit 86 stores a program, data, or the like used in the control circuit 85 and can also be used as an operation area in arithmetic processing. Then, data is transmitted to the modulation circuit 84 from the control circuit 85 and the modulation circuit 84 can subject the antenna 87 to load modulation in accordance with the data. The reader/writer 88 receives the load modulation, to which the antenna 87 is subjected, by a radio wave and can consequently read data.

Further, a wireless tag may incorporate no power source (battery) and supply a power supply voltage to each circuit by a radio wave, or may incorporate a power source (battery) and supply a power supply voltage to each circuit by a radio wave and the power source (battery).

With the structure described in Embodiment Mode 5, a wireless tag which is not easily broken if stressed externally can be manufactured, and thus such a wireless tag can be provided by being attached to an object.

In addition, as a signal transmission method in the above semiconductor device which can communicate data without contact, an electromagnetic coupling method, an electromagnetic induction method, a microwave method, or the like can be used. The transmission method may be appropriately selected by a practitioner in consideration of an intended use, and an optimum antenna may be provided in accordance with the transmission method.

In the case of employing, for example, an electromagnetic coupling method or an electromagnetic induction method (for example, a 13.56 MHz band) as the signal transmission method in the semiconductor device, electromagnetic induction caused by a change in magnetic field density is used. Therefore, the conductive film functioning as an antenna is formed into an annular shape (for example, a loop antenna) or a spiral shape (for example, a spiral antenna).

In the case of employing, for example, a microwave method (for example, a UHF band (860 to 960 MHz band), a 2.45 GHz band, or the like) as the signal transmission method in the semiconductor device, the shape such as a length of the conductive film functioning as an antenna may be appropriately set in consideration of a wavelength of an electromagnetic wave used for signal transmission. For example, the conductive film functioning as an antenna can be formed into a linear shape (for example, a dipole antenna), a flat shape (for example, a patch antenna), a ribbon-like shape, or the like. The shape of the conductive film functioning as an antenna is not limited to a linear shape, and the conductive film functioning as an antenna may be formed in a curved-line shape, a meander shape, or a combination thereof, in consideration of a wavelength of an electromagnetic wave.

Next, an example of application mode of a wireless tag is described. As shown in FIG. 7B, a reader/writer 320 is provided on a side surface of a portable terminal including a display portion 321 and a wireless tag 323 is provided on a side surface of an article 322. When the reader/writer 320 is held over the wireless tag 323 included in the article 322, information on the article 322, such as a raw material, the place of origin, an inspection result in each production process, the history of distribution, or an explanation of the article 322, is displayed on the display portion 321. Furthermore, as shown in FIG. 7C, when a product 326 is transported by a conveyor belt, the product 326 can be inspected using a reader/writer 324 and a wireless tag 325 provided for the product 326. Thus, by utilizing RFID for a system, information can be acquired easily, and added value and improvement in functionality of the system can be achieved. As described in Embodiment Mode 5, a transistor or the like included in a wireless tag can be prevented from being damaged even when the wireless tag is attached to an object having a curved surface, so that a highly reliable wireless tag can be provided.

Further, an applicable range of the wireless tag is wide in addition to the above, and the wireless tag can be applied to any product as long as it clarifies information such as the history of an object without contact and is useful for production, management, or the like. For example, the wireless rag can be mounted on bills, coins, securities, certificates, bearer bonds, packing containers, books, recording media, personal belongings, vehicles, food, clothing, health products, commodities, medicine, electronic devices, and the like. Examples of them is explained with reference to FIGS. 10A to 10H.

Figure 10A:
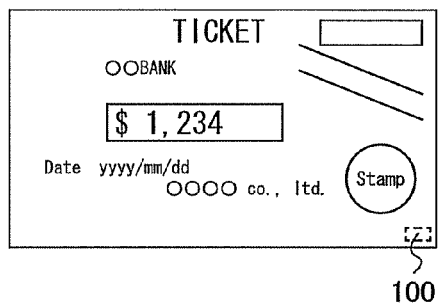
FIGS. 10A to 10H are diagrams each showing an example of a semiconductor device of the present invention.
Figure 10B:
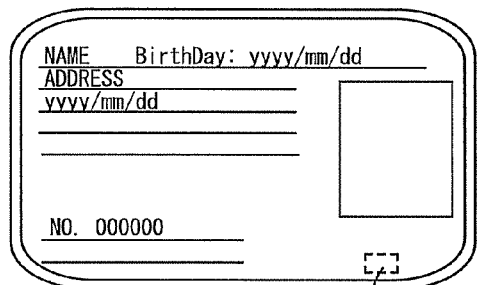
Figure 10C:
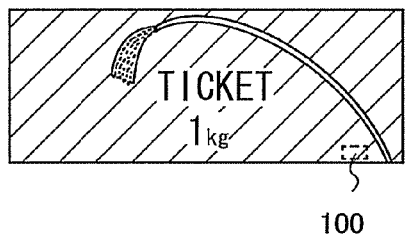
Figure 10D:
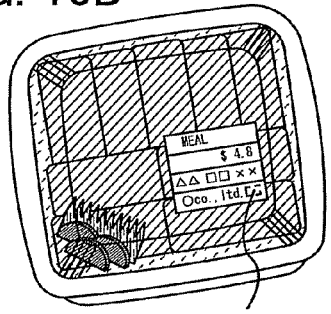
Figure 10E:
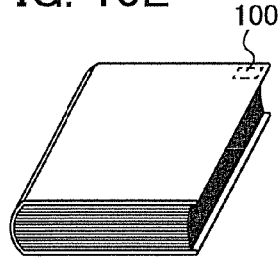
Figure 10F:
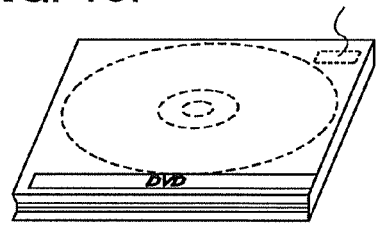
Figure 10G:
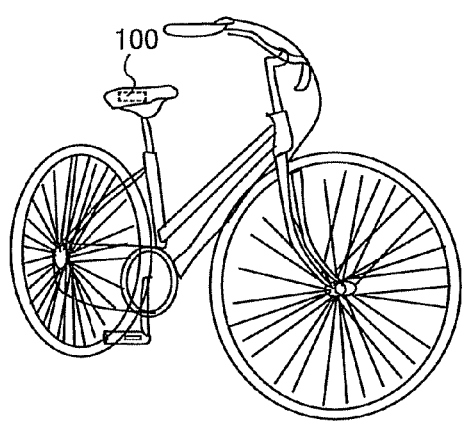
Figure 10H:
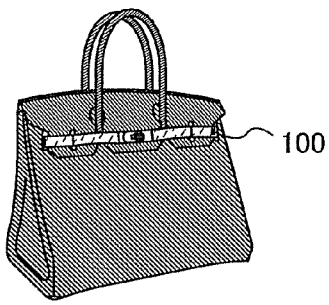

The bills and coins are money distributed to the market, and include one valid in a certain area (cash voucher), memorial coins, and the like. The securities refer to checks, certificates, promissory notes, and the like (FIG. 10A). The certificates refer to driver's licenses, certificates of residence, and the like (FIG. 10B). The bearer bonds refer to stamps, rice coupons, various gift certificates, and the like (FIG. 10C). The packing containers refer to wrapping paper for food containers and the like, plastic bottles, and the like (FIG. 10D). The books refer to hardbacks, paperbacks, and the like (FIG. 10E). The recording media refer to DVD software, video tapes, and the like (FIG. 10F). The vehicles refer to wheeled vehicles such as bicycles, ships, and the like (FIG. 10G). The personal belongings refer to bags, glasses, and the like (FIG. 10H). The food refers to food articles, drink, and the like. The commodities refer to furniture, lighting equipment, and the like. The medicine refers to medical products, pesticides, and the like. The electronic devices refer to liquid crystal display devices, EL display devices, television devices (TV sets and flat-screen TV sets), mobile phones, and the like.

Forgery can be prevented by mounting the wireless tag on the bills, the coins, the securities, the certificates, the bearer bonds, or the like. The efficiency of an inspection system, a system used in a rental shop, or the like can be improved by mounting the wireless tag on the packing containers, the books, the recording media, the personal belongings, the food, the commodities, the electronic devices, or the like. Forgery or theft can be prevented by mounting the wireless tag on the vehicles, the health products, the medicine, or the like; further, in a case of the medicine, medicine can be prevented from being taken mistakenly. The wireless tag can be mounted on the foregoing article by being attached to the surface or being embedded therein. For example, in a case of a book, the wireless tag may be embedded in a piece of paper; in the case of a package made from an organic resin, the wireless tag may be embedded in the organic resin. By using a wireless tag having any of the structures described in Embodiment Modes 1 to 5, breakage or the like of an element included in the wireless tag can be prevented even when the wireless tag is mounted on paper or the like.

Embodiment Mode 7

In this embodiment mode, an example of a case where a semiconductor device of the present invention is applied to a micro-mechanical system called MEMS (micro-electromechanical system) is described with reference to the drawings. MEMS is an abbreviation of a micro-electromechanical system, and is sometimes simply called a micromachine.

Figure 8:
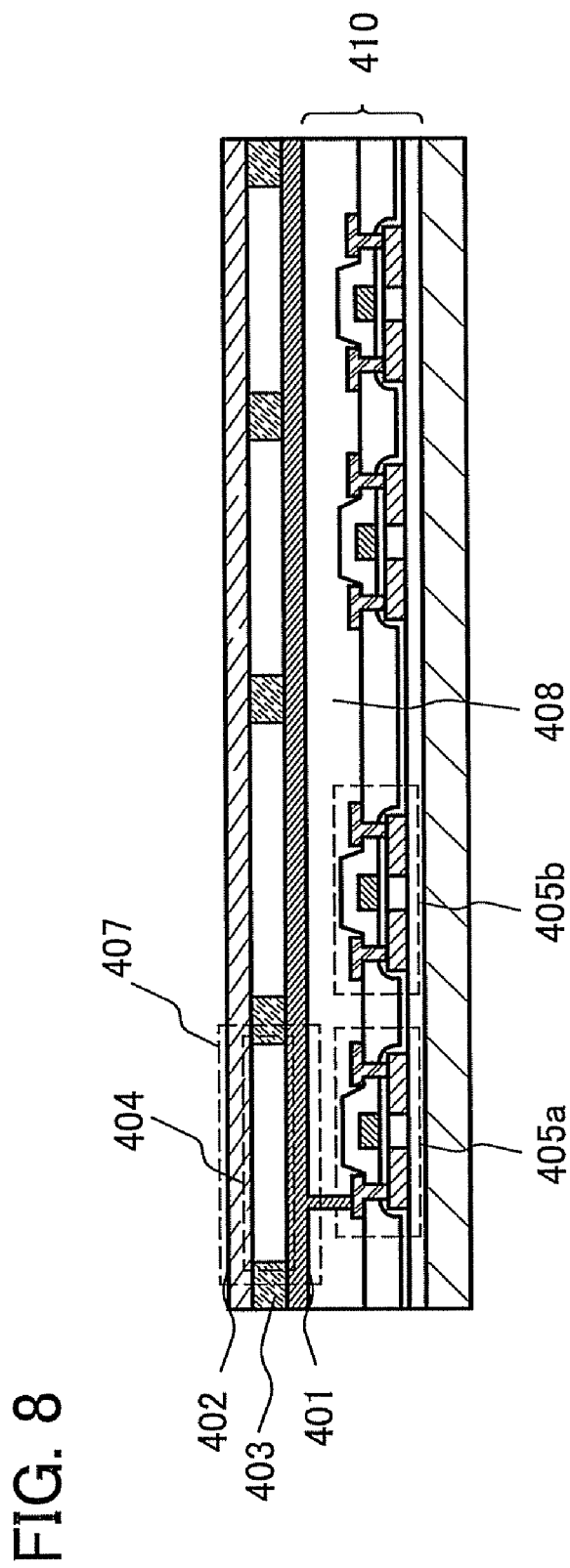
FIG. 8 is a view showing an example of a semiconductor device of the present invention.

As shown in FIG. 8, a micromachine includes a microstructure 407 over an element layer 410 and the microstructure 407 includes a space 404. The element layer 410 and the microstructure 407 are electrically connected, and the element layer 410 controls operation of the microstructure 407 or receives and processes a weak signal outputted from the microstructure 407.

The microstructure 407 includes a first layer 401, a second layer 402, and projecting members 403 provided between both the layers. Further, the microstructure 407 includes the space 404 which is surrounded by the first layer 401, the second layer 402, and the projecting members 403 provided between both the layers.

The projecting members 403 are preferably provided between a transistor 405*a* and a transistor 405*b*.

First, the first layer 401 is formed over the element layer 410. The first layer 401 can be formed using a metal element such as aluminum (Al), tungsten (W), molybdenum (Mo), titanium (Ti), or tantalum (Ta), or a conductive compound containing any of the above-described metal elements as its main component, by a sputtering method, a plasma CVD method, or the like.

Next, the projecting members 403 are formed over the first layer 401. The projecting members 403 can be formed using a material the same as that of the projecting members described in Embodiment Mode 3 (that is, a material having a longitudinal elastic modulus lower than that of the material of the second insulating layer). Further, the projecting members 403 are formed by photolithography and etching. Alternatively, the projecting members 403 can be formed by a droplet discharging method, a printing method such as a screen printing method, a spin coating method, or the like.

Next, the second layer 402 is formed over the projecting members 403. The second layer 402 can be formed using a metal element such as aluminum (Al), tungsten (W), molybdenum (Mo), titanium (Ti), or tantalum (Ta), or a conductive compound containing any of the above-described metal elements as its main component, by a sputtering method, a plasma CVD method, or the like, similarly to the first layer 401.

A three-dimensional structure formed using the projecting members 403 can be used for a variety of applications by making the first layer 401 and the second layer 402 function in the following manner.

It is assumed that the first layer 401 and the second layer 402 are electrodes and in particular, the second layer 402 is an electrode which is transformed due to heat, sound waves, a voltage, or the like. By providing the projecting members 403, a portion of the first layer 401, which is not in contact with the second layer 402, is formed so that the second layer 402 can be moved. In this case, a microstructure in which the second layer 402 is movable in a direction perpendicular to the first layer 401 can be manufactured. Being movable in a direction in which a structural layer receives force if applied with force from external, the microstructure manufactured in this manner can be used as, for example, a micromachine such as a piezoelectric element, a thermoelectric element, or a strain resistor, which detects impulse from heat, sound waves, a voltage, or the like.

With such a structure, if external force is applied to the semiconductor device, stress can be dispersed on the projecting members and thus stress is prevented from being applied to a semiconductor element, and also the semiconductor device is added with a function. Therefore, added value of the semiconductor device is achieved.

Embodiment Mode 8

In this embodiment mode, an example of the case where any of the semiconductor devices described in Embodiment Modes 1 to 5 is applied to a display device is described with reference to the drawings.

Figure 9A:
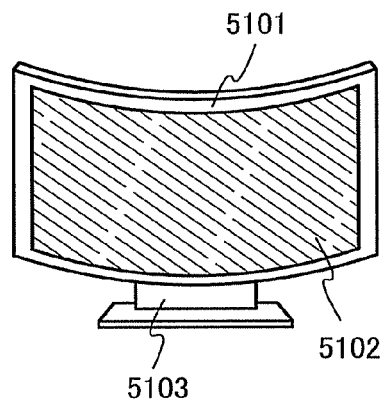
FIGS. 9A to 9F are diagrams each showing an example of a semiconductor device of the present invention.

FIG. 9A shows a display which includes a main body 5101, a supporting base 5103, and a display portion 5102. The display portion 5102 is formed using a substrate to achieve a lightweight and thin display. The display portion 5102 can be curved and detached from the supporting base 5103 so that the display is hung on a wall. When any of the semiconductor devices described in the above embodiment modes is used for the display portion, a circuit, or the like, a display which is not easily broken even if applied with external force can be manufactured.

Figure 9B:
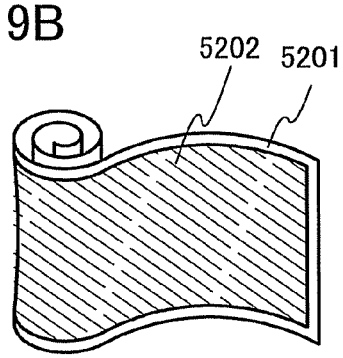

FIG. 9B shows a large display that can be wound, which includes a main body 5201 and a display portion 5202. The main body 5201 and the display portion 5202 are formed using a substrate to carry the display in a bent or wound state. When any of the semiconductor devices described in the above embodiment modes is used for the display portion 5202, a circuit, or the like, a large display which is lightweight and thin and is not easily broken even if applied with external force can be manufactured.

Figure 9C:
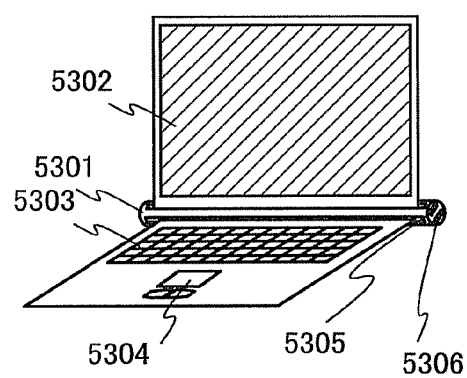

FIG. 9C shows a sheet computer that includes a main body 5301, a display portion 5302, a keyboard 5303, a touch pad 5304, an external connecting port 5305, a power supply plug 5306, and the like. The display portion 5302 is formed using a substrate to achieve a lightweight and thin computer. Further, the display portion 5302 can be wound and stored in the main body if a portion of the power supply plug 5306 is provided with a storage space. When any of the semiconductor devices described in the above embodiment modes is used for the display portion 5302, a circuit, or the like, a computer which is lightweight and thin and is not easily broken even if applied with external force can be manufactured.

Figure 9D:
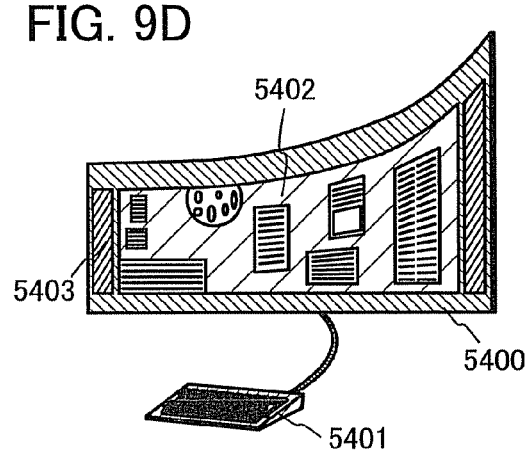

FIG. 9D shows a display device having a large display portion with a size of 20 to 80 inches, which includes a main body 5400, a keyboard 5401 that is an operating portion, a display portion 5402, a speaker 5403, and the like. The display portion 5402 is formed using a flexible substrate, and the main body 5400 can be carried in a bent or wound state with the keyboard 5401 detached. When any of the semiconductor devices described in the above embodiment modes is used for the display portion 5402, a circuit, or the like, a large display device which is lightweight and thin and is not easily broken even if applied with external force can be manufactured.

Figure 9E:
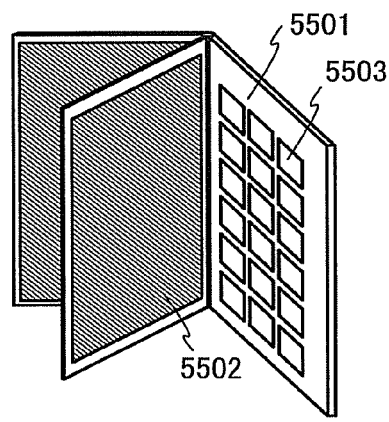

FIG. 9E shows an electronic book that includes a main body 5501, a display portion 5502, an operating key 5503, and the like. A modem may be incorporated in the main body 5501. The display portion 5502 is formed using a flexible substrate to be bent. Further, the display portion 5502 can display a moving image as well as a still image such as a character. When any of the semiconductor devices described in the above embodiment modes is used for the display portion 5502, a circuit, or the like, an electronic book which is lightweight and thin and is not easily broken even if applied with external force can be manufactured.

Figure 9F:
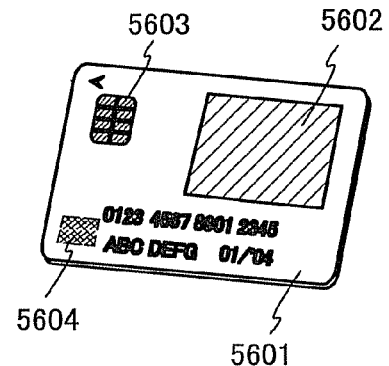

FIG. 9F shows an IC card that includes a main body 5601, a display portion 5602, a connecting terminal 5603, and the like. Since the display portion 5602 is formed using a flexible substrate to be a lightweight and thin sheet type, it can be attached onto a card surface. When the IC card can receive data without contact, data obtained from outside can be displayed on the display portion 5602. Further, the RFID, the MEMS, and the display device of the present invention can be formed over the same substrate.

Further, an IC card is provided with the semiconductor device of the present invention so that the IC card provided with a fingerprint identification sensor 5604 added with an identification function of identifying the owner can be formed. The display portion 5602 can display an image or the like such as the face of the owner and by this function, the identification function of identifying the owner may be achieved. In a case of using the IC card as a credit card, because the display portion 5602 can display an amount such as a purchase amount, whether the credit card has appropriately processed the purchase can be confirmed. By using any of the semiconductor devices described in the above embodiment modes for the display portion 5602, a circuit, or the like, an IC card which is lightweight and thin and is not easily broken even if applied with external force can be manufactured.

The display portions shown in FIGS. 9A to 9F may each have the function of a touch panel. For example, the semiconductor devices of the present invention each provided with a sensor can be used for the display portions 5102, 5202, 5302, 5402, 5502, and 5602. The display portions 5102, 5202, 5302, 5402, 5502, and 5602 make a variety of inputs or operations possible as touch panels. Further, the semiconductor device of the present invention can be used as each signal processing circuit provided in a main body. By using the semiconductor device of the present invention, a display device which is lightweight and thin and is not easily broken even if applied with external force can be manufactured.

Note that this embodiment mode can be freely combined with any of the other embodiment modes.

As described above, the applicable range of the present invention is so wide that the present invention can be applied to electronic appliances and information displaying means of various fields.

This application is based on Japanese Patent Application serial no. 2007-080376 filed with Japan Patent Office on Mar. 26, 2007, the entire contents of which are hereby incorporated by reference.

What is claimed is:

1. A semiconductor device comprising:
a first flexible substrate;
an element layer formed over the first flexible substrate, the element layer comprising a transistor;
an insulating layer formed over the element layer, the insulating layer comprising a first material;
a plurality of projecting members formed over the insulating layer, the plurality of projecting members comprising a second material; and
a second flexible substrate formed over the plurality of projecting members,
wherein a longitudinal elastic modulus of the first material is higher than a longitudinal elastic modulus of the second material, wherein whole bottom surfaces of the plurality of projecting members are in contact with a top surface of the insulating layer, and
wherein whole top surfaces of the plurality of projecting members are in contact with the second flexible substrate.

2. The semiconductor device according to claim 1,
wherein the second material is one selected from the group consisting of polyimide, acrylic, polystyrene, polybenzoxazole, a novolac resin, a silicone resin, and an organic siloxane resin.

3. The semiconductor device according to claim 1,
wherein the transistor is a thin film transistor.

4. The semiconductor device according to claim 1,
wherein the transistor comprises a semiconductor layer comprising a channel formation region, and
wherein the plurality of projecting members are provided so as not to overlap the channel formation region.

5. The semiconductor device according to claim 1,
wherein the first flexible substrate and the second flexible substrate comprise a material selected from glass, plastic, and paper.

6. The semiconductor device according to claim 1,
wherein an interval between the plurality of projecting members is in a rage of from 2 to 200 μm.

7. The semiconductor device according to claim 1,
wherein an interval between the plurality of projecting members is in a rage of from 50 to 150 μm.

8. A semiconductor device comprising:
a first flexible substrate;
an element layer fanned over the first flexible substrate, the element layer comprising a transistor;
an insulating layer formed over the element layer, the insulating layer comprising a first material;
a plurality of projecting members formed over the insulating layer, the plurality of projecting members comprising a second material; and
a second flexible substrate formed over the plurality of projecting members,
wherein a longitudinal elastic modulus of the first material is higher than a longitudinal elastic modulus of the second material,
wherein whole bottom surfaces of the plurality of projecting members are in contact with a top surface of the insulating layer,
wherein whole top surfaces of the plurality of projecting members are in contact with the second flexible substrate, and
wherein a width of the plurality of projecting members is equal to or longer than 1 μm.

9. The semiconductor device according to claim 8,
wherein the second material is one selected from the group consisting of polyimide, acrylic, polystyrene, polybenzoxazole, a novolac resin, a silicone resin, and an organic siloxane resin.

10. The semiconductor device according to claim 8,
wherein the transistor is a thin film transistor.

11. The semiconductor device according to claim 8,
wherein the transistor comprises a semiconductor layer comprising a channel formation region, and
wherein the plurality of projecting members are provided so as not to overlap the channel formation region.

12. The semiconductor device according to claim 8,
wherein the first flexible substrate and the second flexible substrate comprise a material selected from glass, plastic, and paper.

13. The semiconductor device according to claim 8,
wherein an interval between the plurality of projecting members is in a rage of from 2 to 200 μm.

14. The semiconductor device according to claim 8,
wherein an interval between the plurality of projecting members is in a rage of from 50 to 150 μm.

15. A semiconductor device comprising:
a first flexible substrate;
an element layer formed over the first flexible substrate, the element layer comprising a transistor;
an insulating layer formed over the element layer, the insulating layer comprising a first material;
a plurality of projecting members formed over the insulating layer, the plurality of projecting members comprising a second material; and
a second flexible substrate formed over the plurality of projecting members,
wherein a longitudinal elastic modulus of the first material is higher than a longitudinal elastic modulus of the second material,
wherein whole bottom surfaces of the plurality of projecting members are in contact with a top surface of the insulating layer,
wherein whole top surfaces of the plurality of projecting members are in contact with the second flexible substrate, and
wherein a longitudinal elastic modulus of the second material is equal to or less than 4.2 GPa.

16. The semiconductor device according to claim 15,
wherein the second material is one selected from the group consisting of polyimide, acrylic, polystyrene, polybenzoxazole, a novolac resin, a silicone resin, and an organic siloxane resin.

17. The semiconductor device according to claim 15,
wherein the transistor is a thin film transistor.

18. The semiconductor device according to claim 15,
wherein the transistor comprises a semiconductor layer comprising a channel formation region, and
wherein the plurality of projecting members are provided so as not to overlap the channel formation region.

19. The semiconductor device according to claim 15,
wherein the first flexible substrate and the second flexible substrate comprise a material selected from glass, plastic, and paper.

20. The semiconductor device according to claim 15,
wherein an interval between the plurality of projecting members is in a rage of from 2 to 200 μm.

21. The semiconductor device according to claim 15,
wherein an interval between the plurality of projecting members is in a rage of from 50 to 150 μm.

* * * * *